(12) United States Patent
Moon et al.

(10) Patent No.: US 8,432,041 B2
(45) Date of Patent: Apr. 30, 2013

(54) SEMICONDUCTOR DEVICES AND METHODS OF MANUFACTURE THEREOF

(75) Inventors: Bum Ki Moon, LaGrangeville, NY (US); Danny Pak-Chum Shum, Poughkeepsie, NY (US); Moosung Chae, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 12/728,813

(22) Filed: Mar. 22, 2010

(65) Prior Publication Data

US 2010/0171185 A1 Jul. 8, 2010

Related U.S. Application Data

(62) Division of application No. 11/602,885, filed on Nov. 21, 2006, now Pat. No. 7,713,866.

(51) Int. Cl.
*H01L 23/48* (2006.01)
*H01L 23/54* (2006.01)
*H01L 29/40* (2006.01)

(52) U.S. Cl.
USPC .................. 257/774; 257/758; 257/E29.255

(58) Field of Classification Search .............. 257/774, 257/758, 761, 211, E29.255
See application file for complete search history.

(56) References Cited

U.S. PATENT DOCUMENTS

| 5,221,449 | A | 6/1993 | Colgan et al. |
|---|---|---|---|
| 5,504,041 | A | 4/1996 | Summerfelt |
| 6,040,243 | A | * 3/2000 | Li et al. .................. 438/687 |
| 6,140,234 | A | 10/2000 | Uzoh et al. |
| 6,281,121 | B1 | 8/2001 | Brown et al. |
| 6,291,885 | B1 | 9/2001 | Cabral, Jr. et al. |
| 6,297,154 | B1 | 10/2001 | Gross et al. |
| 6,380,083 | B1 | 4/2002 | Gross |
| 6,437,440 | B1 | 8/2002 | Cabral, Jr. et al. |
| 6,509,267 | B1 | 1/2003 | Woo et al. |
| 6,596,631 | B1 | 7/2003 | Ngo et al. |
| 6,607,977 | B1 | 8/2003 | Rozbicki et al. |
| 6,727,592 | B1 | 4/2004 | Woo et al. |
| 6,743,719 | B1 | 6/2004 | Chen et al. |
| 6,753,610 | B1 | 6/2004 | Fukiage |

(Continued)

FOREIGN PATENT DOCUMENTS

| EP | 0 751 566 A2 | 1/1997 |
|---|---|---|
| EP | 0 982 771 A1 | 3/2000 |

OTHER PUBLICATIONS

Barnat, E.V., et al., "Real Time Copper Resistivity Measurements During Sputter Deposition," Interconnect Technology Conference, IEEE, 2001, pp. 24-26.

(Continued)

*Primary Examiner* — Chuong A Luu
*Assistant Examiner* — Nga Doan
(74) *Attorney, Agent, or Firm* — Slater & Matsil, L.L.P.

(57) ABSTRACT

Semiconductor devices and methods of manufacture thereof are disclosed. A preferred embodiment comprises a method of forming a barrier layer. The method of forming the barrier layer includes providing a workpiece, forming a first material layer over the workpiece, the first material layer comprising a nitride-based metal compound. A second material layer is formed over the first material layer. The second material layer comprises Ta or Ti. The barrier layer comprises the first material layer and at least the second material layer.

26 Claims, 3 Drawing Sheets

U.S. PATENT DOCUMENTS

| | | | |
|---|---|---|---|
| 6,858,524 | B2 | 2/2005 | Haukka et al. |
| 6,900,498 | B2 | 5/2005 | Stauf et al. |
| 6,911,124 | B2 | 6/2005 | Tang et al. |
| 6,911,391 | B2 | 6/2005 | Yang et al. |
| 6,955,986 | B2 * | 10/2005 | Li ................................. 438/687 |
| 6,992,390 | B2 | 1/2006 | Edelstein et al. |
| 7,098,134 | B2 | 8/2006 | Kim |
| 7,199,040 | B2 | 4/2007 | Yang et al. |
| 7,294,241 | B2 | 11/2007 | Seet et al. |
| 7,498,264 | B2 * | 3/2009 | Mehard et al. ................ 438/692 |
| 2003/0087490 | A1 | 5/2003 | Abe |
| 2005/0054191 | A1 * | 3/2005 | Yu et al. ........................ 438/629 |

OTHER PUBLICATIONS

Jiang, Q.T., et al., "Line Width Dependence of Copper Resistivity," Interconnect Technology Conference, IEEE, 2001, pp. 227-229.

Zschech, E., et al., "Microstructure characterization of metal interconnects and barrier layers: status and future," Interconnect Technology Conference, IEEE, 2000, pp. 233-235.

Ou, K.-L., et al., "Barrier Capability of Hf-N Films with Various Nitrogen Concentrations Against Copper Diffusion in Cu/Hf-N/n$^+$-p Junction Diodes," Journal of The Electrochemical Society, vol. 152, No. 2, 2005, pp. G138-G143.

Shinkai, S., et al., "Influence of Sputtering Parameters on the Formation Process of High-Quality and Low-Resistivity HfN Thin Film," Japanese Journal of Applied Physics, vol. 38, Part 1, No. 4A, Apr. 1999, pp. 2097-2102.

Yoshimoto, K., et al., "Application of HfN/Hf Bilayered Film as a Diffusion Barrier for Cu Metallization System of Si Large-Scale Integration," Japanese Journal of Applied Physics, vol. 39, Part 1, No. 4A, Apr. 2000, pp. 1835-1839.

Yu, H. Y., et al., "Thermally Robust HfN Metal as a Promising Gate Electrode for Advanced MOS Device Applications," IEEE Transactions on Electron Devices, vol. 51, No. 4, Apr. 2004, pp. 609-615.

\* cited by examiner

SEMICONDUCTOR DEVICES AND METHODS OF MANUFACTURE THEREOF

This application is a divisional of patent application Ser. No. 11/602,885, filed on Nov. 21, 2006, now U.S. Pat. No. 7,713,866 which application is incorporated herein by reference.

TECHNICAL FIELD

The present invention relates generally to the fabrication of semiconductors, and more particularly to structures and methods of forming barrier layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

In the past, aluminum was typically used as a conductive line material in integrated circuits. Silicon dioxide was typically used as the insulating material between the aluminum conductive lines. However, as semiconductor devices are scaled down in size, there is a trend towards the use of copper for an interconnect material, in conjunction with the use of low dielectric constant (k) materials. Advantages of using copper for interconnects in integrated circuits include decreased resistivity, resulting in increased speed, decreased RC time delay, and the ability to form thinner conductive lines.

However, there are some challenges in working with copper in a manufacturing process. While aluminum may be subtractively etched, copper is difficult to subtractively etch, and thus, damascene processes are typically used to form copper conductive features. In a damascene process, a dielectric material is deposited over a wafer, and then the dielectric material is patterned with a conductive feature pattern. The conductive feature pattern typically comprises a plurality of trenches, for example. The trenches are then filled in with conductive material, and a chemical-mechanical polish (CMP) process is used to remove the excess conductive material from the top surface of the dielectric material. The conductive material remaining within the dielectric material comprises conductive features such as conductive lines or vias, as example.

Copper has a tendency to diffuse into adjacent material layers, such as the insulating layers the copper interconnects are formed in. Thus, diffusion barriers are sometimes used to prevent the diffusion of copper. Typical diffusion barrier materials are Ta and TaN, as examples. Because these materials have a higher resistance than copper, the diffusion barriers are typically deposited in a thin layer in order to avoid excessively increasing the resistance of conductive features. These thin conventional diffusion barriers have a tendency towards the formation of weak spots and holes, which may permit copper to diffuse into adjacent material layers, which causes device failures.

Furthermore, Ta and TaN barrier layers tend to form an oxide at the interface of some insulating materials, which increases the resistance. Particularly in lower metallization layers, thermal budget limits may result in oxidation of the barrier layers, which may result in increased effective dielectric constant ($k_{eff}$) values and a higher capacitance, which increases an RC delay of conductive lines.

Thus, what are needed in the art are improved diffusion barrier layers and methods of formation thereof.

SUMMARY OF THE INVENTION

These and other problems are generally solved or circumvented, and technical advantages are generally achieved, by preferred embodiments of the present invention, which provide improved methods of forming barrier layers and structures thereof.

In accordance with a preferred embodiment of the present invention, a method of forming a barrier layer includes providing a workpiece, forming a first material layer over the workpiece, the first material layer comprising a nitride-based metal compound, and forming a second material layer over the first material layer, the second material layer comprising Ta or Ti. The barrier layer comprises the first material layer and at least the second material layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the formation of barrier layers over insulating material layers. The invention may also be applied, however, to the formation of barrier layers on other material layers, such as semiconductive materials or conductive materials, as examples.

Embodiments of the present invention achieve technical advantages by providing novel methods of forming barrier layers having improved properties, such as improved diffusion prevention and increased resistance to oxidation, as examples.

Figure 1:
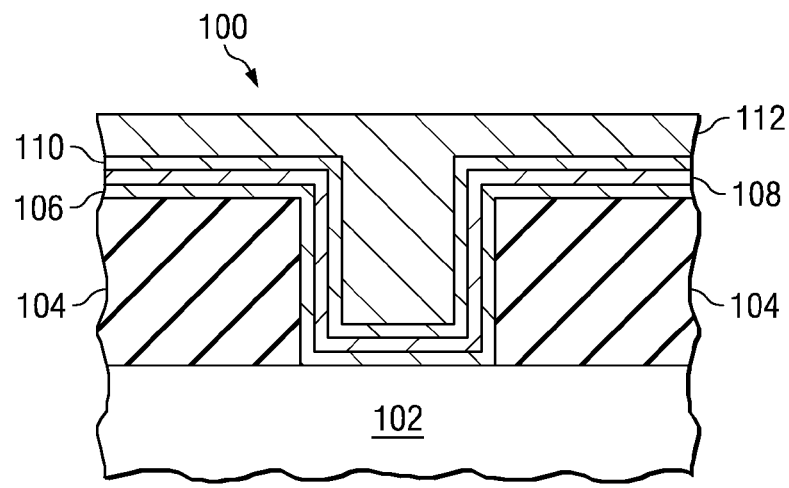
FIGS. 1 and 2 show cross-sectional views of a semiconductor device at various stages of manufacturing in accordance with an embodiment of the invention, wherein a barrier layer comprises a first layer of HfN and a second layer of Ta or Ti disposed over the first layer of HfN.
Figure 2:
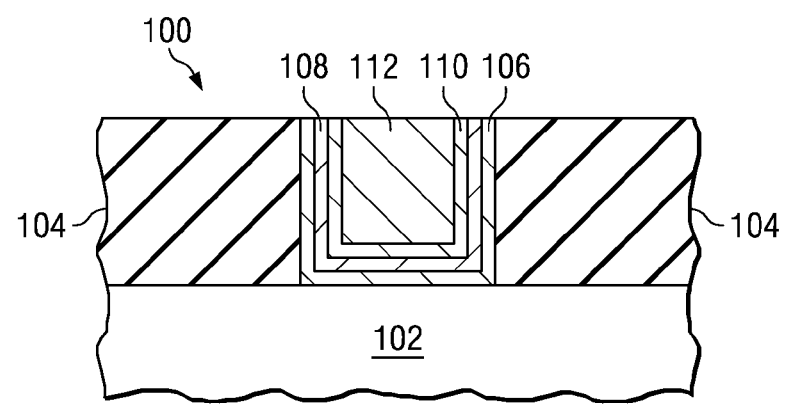

FIGS. 1 and 2 show cross-sectional views of a semiconductor device 100 at various stages of manufacturing in accordance with an embodiment of the invention. Referring first to FIG. 1, the semiconductor device 100 includes a workpiece 102. To manufacture the device 100, first, the workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A material layer 104 is formed over the workpiece 102. The material layer 104 may comprise conductive, insulative, or semiconductive materials, for example. In one embodiment of the invention, the material layer 104 preferably comprises an insulating material layer 104, for example. The insulating material layer 104 preferably comprises insulating materials typically used in semiconductor manufacturing for inter-level dielectric (ILD) layers, such as $SiO_2$, tetra ethyl oxysilane (TEOS), fluorinated TEOS (FTEOS), spin-on glass (SOG), SiN, SiON, or low k insulating materials, e.g., having a dielectric constant of about 4 or less, or combinations or multiple layers thereof, as examples, although alternatively, the material layer 104 may comprise other materials. The insulating material layer 104 may comprise dense SiCOH or a porous dielectric having a k value of about 3 or lower, as examples. The insulating material layer 104 may also comprise an ultra-low k (ULK) material having a k value of about 2.3 or lower, for example.

The insulating material layer 104 may comprise a thickness of about 500 nm or less, for example, although alternatively, the insulating material layer 104 may comprise other dimensions. The insulating material layer 104 may have been previously patterned using lithography, as shown, e.g., in a damascene process, although alternatively, the material layer 104 may be planar and unpatterned (not shown in the Figures). The insulating material layer 104 may be patterned using a reactive ion etch (RIE) and ash process, for example, followed by a damage recovery process, such as a wet etch and/or silylation, as examples, although other etch processes may also be used to pattern the insulating material layer 104.

A barrier layer 106/108 is formed over the insulating material layer 104. The barrier layer 106/108 is formed by first forming a first material layer 106 over the insulating material layer 104, and over exposed portions of the workpiece 102, if the insulating material layer 104 has been patterned, as shown. Note that embodiments of the present invention are also useful in applications where a material layer such as insulating material layer 104 has not been patterned; e.g., wherein the insulating material layer 104 is planar (not shown in the figures).

The first material layer 106 preferably comprises a nitride-based metal compound. In a preferred embodiment, the first material layer 106 preferably comprises HfN, for example. The first material layer 106 may also comprise other nitride-containing materials, such as other nitride-containing high k materials having a dielectric constant or k value greater than the dielectric constant of $SiO_2$, e.g., insulating materials comprising nitride having a dielectric constant of about 3.9 or greater. The first material layer 106 may also comprise other transition metal nitride materials, for example. The first material layer 106 comprises an anti-oxidation layer in some embodiments, for example.

The first material layer 106 in some embodiments preferably comprises a material comprising $[a, b]_x N_y$, wherein the elements a and b preferably comprise a metal component. Elements a and b preferably comprise elements within columns IVb, Vb, or VIb of the periodic table, for example. Elements within these columns of the periodic table form good metallic nitrides for use in some embodiments of the present invention, for example. The first material layer 106 preferably comprises one or more elements within column IVb, Vb, or VIb combined with nitride. In some embodiments, the first material layer 106 preferably comprises a ternary compound of two elements within columns IVb, Vb, or VIb combined with nitride, for example. Preferably, in some embodiments, the first material layer 106 comprises either one element or two elements from columns IVb, Vb, or VIb of the periodic table combined with nitride.

The first material layer 106 preferably comprises a thickness of about 100 Angstroms or less, and more preferably comprises a thickness of about 5 to 50 Angstroms in some embodiments, for example. In some embodiments, the first material layer 106 preferably comprises a monolayer of HfN, for example. In these embodiments, the first material layer 106 may comprise a thickness of about 10 Angstroms or less, or more preferably, comprises about 6 Angstroms or less, for example.

The first material layer 106 comprised of HfN is preferably deposited by atomic layer deposition (ALD), for example, although alternatively, the first material layer 106 may be formed using other methods. The first material layer 106 may alternatively be formed by physical vapor deposition (PVD), as an example. In some embodiments, the first material layer 106 may comprise a single atomic layer or multiple atomic layers of HfN, for example. The first material layer 106 is preferably substantially conformal, e.g., the first material layer 106 preferably conforms to the underlying topography of the material layer 104, lining the top surface and sidewalls and the exposed top surface of the workpiece 102.

Next, a second material layer 108 is formed over the first material layer 106. The second material layer 108 preferably comprises Ta or Ti in accordance with preferred embodiments of the present invention. The second material layer 108 is preferably deposited by ALD or PVD, as examples, although other deposition methods may also be used to form the second material layer 108. The second material layer 108 preferably comprises a thickness of about 100 Angstroms or less, although alternatively, the second material layer 108 comprised of Ta or Ti may comprise other dimensions, for example.

In some embodiments, the first material layer 106 and second material layer 108 are formed in situ, e.g., in the same processing chamber (not shown), preferably without removing the workpiece 102 from the processing chamber, for example. In some embodiments of the present invention, for example, the workpiece 102 is placed in a first chamber prior to the deposition of the first material layer 106 of the barrier layer 106/108, and the workpiece 102 is not removed from the first chamber until the first material layer 106 and second material layer 108 are formed over the workpiece 102, for example. In other embodiments, for example, the workpiece 102 is exposed to a vacuum while in the first chamber, and the vacuum is not removed until after all of the barrier materials 106 and 108 (and the optional third material layer 214 shown in FIG. 3, to be described further herein) have been formed over the workpiece 102, for example.

A seed layer 110 is formed over the second material layer 108 of the barrier layer 106/108, as shown in FIG. 1. The seed layer 110 preferably comprises copper in one embodiment, for example, although the seed layer 110 may alternatively comprise other materials. The seed layer 110 may comprise a thickness of about 500 Angstroms or less, for example, although the seed layer may also comprise other dimensions. The seed layer 110 may comprise pure copper that is adapted to facilitate in the deposition of a subsequently deposited conductive material 112, for example. The seed layer 110 preferably comprises a metal adapted to promote plating properties of a subsequently-formed conductive material 112, for example. The seed layer 110 preferably comprises a metal, for example, in some embodiments.

A conductive material 112 is then formed over the seed layer 110, as shown in FIG. 1. The conductive material 112 preferably comprises copper in some embodiments, although alternatively, the conductive material 112 may comprise copper, aluminum, tungsten, combinations or alloys thereof, as examples, or other materials. The conductive material 112 may be formed by electroplating, for example, although other deposition techniques may also be used to form the conductive material 112. The conductive material 112 is also referred to herein as a conductive fill material, for example.

Excess conductive material 112, seed layer 110, second material layer 108, and first material layer 106 are then removed from over the top surface of the insulating material layer 104 e.g., using a CMP process, leaving conductive features comprised of the conductive material 112, seed layer 110, and the barrier layer 106/108 formed in the patterns in the insulating material layer 104.

Figure 3:
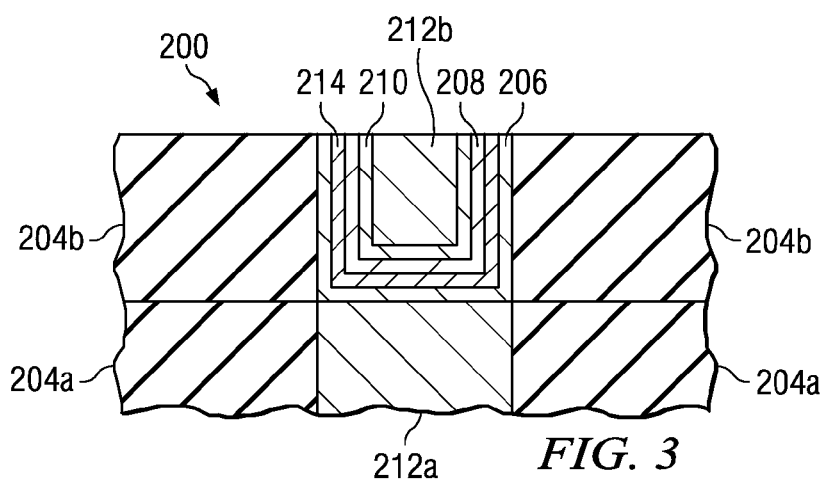
FIG. 3 shows a cross-sectional view of a semiconductor device in accordance with another embodiment of the invention, wherein the barrier layer further comprises a layer of TaN or TiN disposed between the first layer of HfN and the second layer of Ta or Ti.
Figure 4:
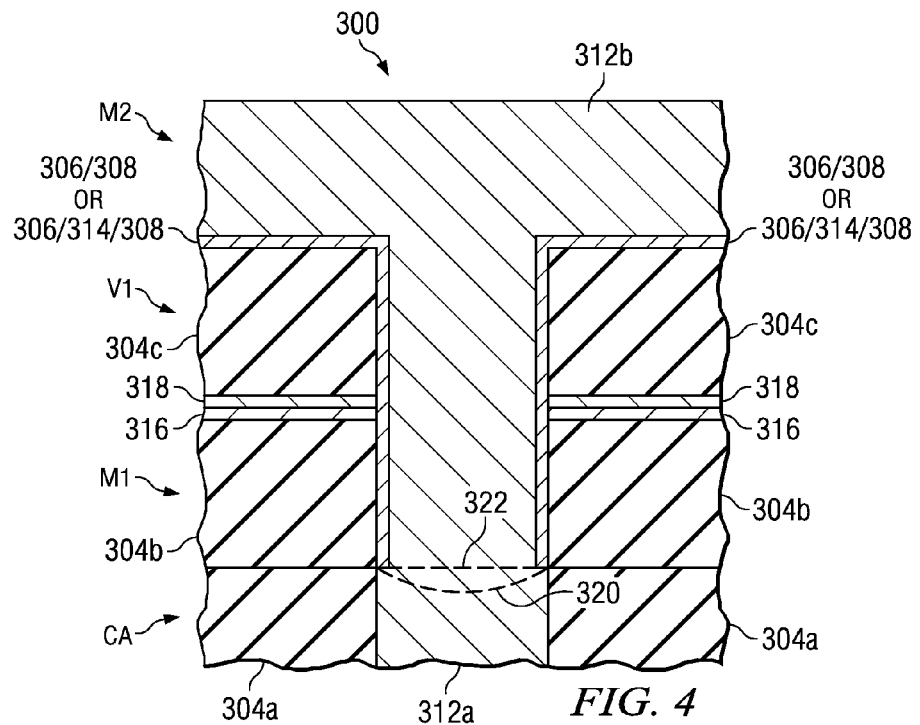
FIG. 4 shows a cross-sectional view of a semiconductor device in accordance with another embodiment of the invention, wherein the barrier layer is removed from a bottom surface of a trench before filling the trench with a conductive material.
Figure 5:
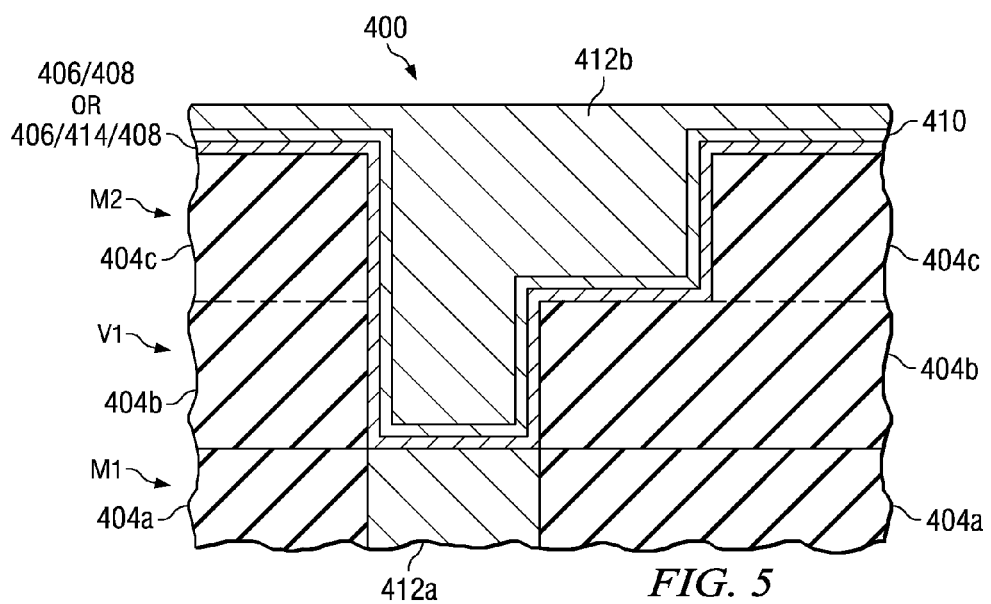
FIG. 5 shows a cross-sectional view of a semiconductor device in accordance with another yet embodiment of the invention, wherein the barrier layer is implemented in a dual damascene structure.

FIGS. 3, 4, and 5 show additional preferred embodiments of the present invention. Like numerals are used for the various elements that were described in FIGS. 1 and 2. To avoid repetition, each reference number shown in FIGS. 3, 4, and 5 is not described again in detail herein. Rather, similar materials x02, x04, x06, x08, etc. are preferably used for the various material layers shown as were described for FIGS. 1 and 2, where x=1 in FIGS. 1 and 2, x=2 in FIG. 3, x=4 in FIG. 5, and x=5 in FIG. 6. As an example, the preferred and alternative materials and dimensions described for the first material layer 106 and the second material layer 108 of the barrier layer 106/108 in the description for FIGS. 1 and 2 are preferably also used for the material layers 206 and 208 shown in FIG. 3.

FIG. 3 shows a cross-sectional view of a semiconductor device 200 in accordance with another embodiment of the invention, wherein the barrier layer 206/214/208 further comprises a third material layer 214 disposed between the first material layer 206 and the second material layer 208. The third material layer 214 preferably comprises a layer of TaN or TiN disposed between the first material layer 206 of HfN and the second material layer 208 of Ta or Ti.

In this embodiment, after forming the first material layer 206, the third material layer 214 is preferably deposited using ALD or PVD directly over and abutting the first material layer 206 comprised of HfN. The third material layer 214 preferably comprises a thickness of about 100 Angstroms or less, for example. Alternatively, the third material layer 214 may be deposited using other methods and may comprise other dimensions, for example. In this embodiment, the second material layer 208 is preferably deposited directly over and abutting the third material layer 214 that is disposed over the first material layer 206, as shown.

If the optional third material layer 214 comprising TaN or TiN is included, preferably the third material layer 214 is disposed between the first material layer 206 comprising HfN and the second material layer 208 comprising Ta or Ti. In some applications, e.g., wherein the conductive fill material 212 comprises copper, the second material layer 208 that may comprise Ta is preferably used that is adapted to prevent diffusion of copper (e.g., the conductive fill material 212) into adjacent material layers, for example.

In the example shown in FIG. 3, the workpiece (not shown in FIG. 3; see FIGS. 1 and 2) may include a first insulating material layer 204a formed at a top surface thereof, as shown. The first insulating material layer 204a may comprise a first ILD layer in which conductive features such as conductive line 212a have been previously formed, for example. A second insulating material layer 204b is deposited over the first insulating material layer 204a and conductive line 212a. The second insulating material layer 204b may comprise a second ILD layer, for example. The second insulating material layer 204b is patterned with a plurality of trenches for conductive features. The pattern for at least one of the trenches may be disposed directly over the conductive feature 212a in the underlying insulating material layer 204a, as shown.

The novel barrier layer 206/214/208 of embodiments of the present invention is formed over the patterned second insulating material layer 204b, lining the trenches in the second insulating material layer 204b and the exposed top surfaces of the conductive line 212a. A seed layer 210 is formed over the barrier layer 206/214/208, and a conductive fill material 212b is formed over the seed layer 210, as shown. Excess conductive fill material 212b, seed layer 210, and barrier layer 206/214/208 are removed from over the top surface of the second insulating material layer 204b, e.g., using a CMP process and/or etch process, leaving the structure shown in FIG. 3. Processing of the semiconductor device 200 is then continued, e.g., by depositing additional insulating material layers and forming conductive features therein, not shown.

In the embodiment shown in FIG. 3, the barrier layer 206/214/208 is left residing over the top surface of the underlying conductive feature 212a before the seed layer 210 and conductive material layer 212b are formed. The barrier layer 206/214/208 materials are conductive and thus they be left remaining in the semiconductor device 200 over the conductive feature 212a in some embodiments. However, in other embodiments of the present invention, the barrier layer 206/214/208 may comprise a higher resistance than the seed layer 210 and conductive fill material 212b, and thus, it may be desirable in some applications to remove the barrier layer 206/214/208 from the top surface of the conductive feature 212a before filling the trench with the seed layer and/or conductive fill material 212b. This may be achieved using an anisotropic etch process of the barrier layer 206/214/208 before the seed layer and/or conductive fill material 212b are formed, for example.

The barrier layers 106/108 and 206/214/208 shown in FIGS. 2 and 3 have improved barrier properties. The barrier layers 106/108 and 206/214/208 prevent diffusion of the materials such as copper in the seed layers 110 and 210 and conductive fill materials 112 and 212b into adjacent insulating material layers, such as insulating material 104 or the workpiece 102 in FIG. 2, or into insulating materials 204b and 204a in FIG. 3.

The first material layer 106 and 206 of the barrier layers 106/108 and 206/214/208, respectively, advantageously comprises HfN. HfN has excellent anti-oxidation properties and exhibits excellent qualities when applied to an oxide, e.g., after thermal treatments such as rapid thermal anneal processes. HfN has a low enthalpy change dH of oxidation at an ILD interface. Preferably, the first material layer 106 and 206 comprising HfN is extremely thin and the formation thereof using ALD is well-controlled, so that conductive features formed using the novel barrier layers 106/108 or 206/214/208 achieve a low series resistance Rs value and a low parasitic capacitance.

The embodiments shown in FIGS. 1, 2, and 3 illustrate single damascene methods of forming conductive features of a semiconductor device 100 or 200. In a single damascene process, a single layer of insulating material 104 or 204b is patterned with a pattern for conductive features, such as conductive lines, conductive vias, or contacts, as example. Embodiments of the present invention may also be implemented in dual or multiple damascene processes, wherein two or more insulating material layers are patterned with patterns for conductive features and are later filled in a single fill step with a conductive material.

FIG. 4 shows a cross-sectional view of a semiconductor device 300 in accordance with another embodiment of the invention, wherein the novel barrier layer 306/308 or 306/314/308 is implemented in a dual damascene structure. In this embodiment, the barrier layer is removed from a bottom surface of a trench 322 before filling the trench with a conductive material 312b.

In this embodiment, a multi-layer interconnect structure is shown. The workpiece (not shown) includes a first insulating material layer 304a comprising a contact CA layer disposed proximate a top surface thereof. Conductive features 312a may be formed in a first CA or metallization layer of the semiconductor device, comprised of a conductive material 312a such as copper, for example.

A second insulating material layer 304b comprising an ILD material is formed over the first insulating material layer 304a. One or more optional thin insulating material layers 316 and 318 may be deposited over the second insulating material layer 304b. The thin insulating material layers 316 and/or 318 may comprise etch stop layers and/or barrier layers, for example. In one embodiment, the thin insulating material layer 316 may comprise a hard mask such as TEOS, and the thin insulating material layer 318 may comprise a cap layer such as CoWP, as examples, although other insulating materials may also be used.

A third insulating material layer 304c comprising an ILD material is deposited over the thin insulating material layer 318. The third insulating material layer 304c and the second insulating material layer 304b are patterned, e.g., a pattern for conductive lines may be formed in the second insulating material 304b in the M1 layer, and a pattern for vias may be formed in the third insulating material 304c. The novel barrier layer 306/308 or 306/314/308 described herein with reference to FIGS. 1, 2, and 3 is formed over the patterned insulating material layers 304b and 304c. Note that a seed layer (not shown) may be formed over the barrier layer 306/308 or 306/314/308 prior to forming the conductive material 312b.

In this embodiment, the barrier layer 306/308 or 306/314/308 is anisotropically etched, e.g., using an etch process adapted to remove the barrier layer 306/308 or 306/314/308 material more rapidly or preferentially on top surfaces of the semiconductor device 300 than on sidewalls of features, e.g., within the trenches. Preferably, all of the barrier layer 306/308 or 306/314/308 material is removed from over the bottom 322 of the trenches. In some embodiments, the anisotropic etch of the barrier layer 306/308 or 306/314/308 may result in forming a recess 320 in the top surface of the underlying conductive features 320, as shown in phantom in FIG. 4, for example.

The various insulating material layers 304a, 304b, 304c may comprise metallization layers in a multi-level interconnect structure of the semiconductor device 300, as shown. For example, insulating material layer 304a and conductive feature 312a may comprise a CA or contact layer; insulating material layer 304b and a portion of conductive material 312b may comprise a first metallization layer M1; and insulating material layer 304c and a portion of the conductive material 312b may comprise a first via layer V1. Additional interconnect layers such as M2 may be formed over the interconnect layers CA, M1, and V1 shown, for example, after the CMP of excess conductive material 312b and barrier layer 306/308 or 306/314/308 from over the top surface of the insulating material layer 304c.

In some embodiments, an anisotropic etch process of the barrier layer 306/308 or 306/314/308 may be performed after the formation of the HfN-containing first material layer 306, not shown. The first material layer 306 is removed from the bottom 322, and optionally, the underlying conductive material 312a may be recessed during the anisotropic etch process, as shown at 320. Then, the second material layer 308, or the third material layer 314 and also the second material layer 308, may be formed over the exposed conductive material 312a at the bottom of the trench, and over the first material layer 306 on the sidewalls of the trenches, for example.

FIG. 5 shows a cross-sectional view of a semiconductor device 400 in accordance with another yet embodiment of the invention, wherein the barrier layer 406/408 or 406/414/408 is implemented in a dual damascene structure. In this embodiment, patterns for vias are formed in a second insulating material layer 404b, and patterns for conductive lines are formed in a third insulating material layer 404c disposed over the second insulating material layer 404b. The barrier layer 406/408 or 406/414/408 is formed over the patterned second insulating material layer 404b and third insulating material layer 404c, a seed layer 410 is formed over the barrier layer 406/408 or 406/414/408, and the remainder of the patterns in the second insulating material layer 404b and third insulating material layer 404c are simultaneously filled in a single fill process with the conductive fill material 412b, forming vias in the patterned second insulating material layer 404b and forming conductive lines in the third insulating material layer 404c.

Figure 6:
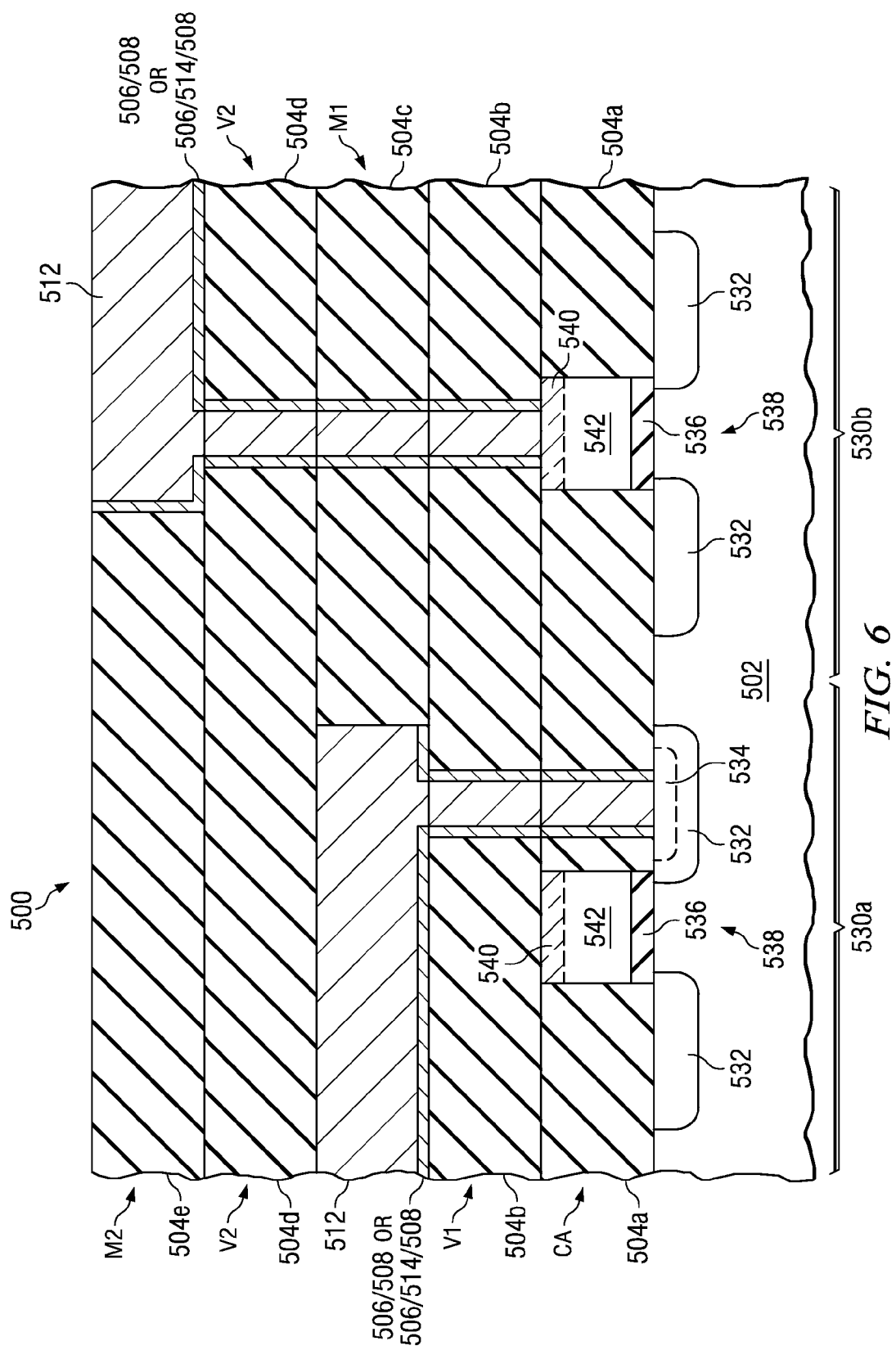
FIG. 6 shows a cross-sectional view of a semiconductor device in accordance with another embodiment of the invention, wherein the barrier layer is implemented in the formation of contacts in a back end of line (BEOL) manufacturing process.

FIG. 6 shows a cross-sectional view of a semiconductor device 500 in accordance with yet another embodiment of the invention. In this embodiment, the novel barrier layer 506/508 or 506/514/508 is implemented in the formation of contacts in a back end of line (BEOL) manufacturing process. Transistors 538 and other devices (not shown) are formed in a front end of the line (FEOL) process, within and over a workpiece 502. The transistors 538 may include active areas 532 such as source and drain regions formed within the workpiece 502. The transistors 538 may include a gate dielectric 536 and a gate 542 disposed over the gate dielectric 536. A portion 540 of the transistor gates 542 may be silicided, and a portion 534 of the source or drain regions 532 of the transistors 538 may also be silicided, as shown in phantom.

The insulating material layers 504a, 504b, 504c, 504d, and 504e of the multi-level interconnect structure may be patterned as needed to provide electrical contact to underlying devices. The novel barrier layer 506/508 or 506/514/508 described herein is formed over at least sidewalls of the patterned insulating material layers 504a, 504b, 504c, 504d, and 504e, and a conductive fill material 512 is deposited over the barrier layer 506/508 or 506/514/508. For example, in region 530a of the semiconductor device 500, a conductive line 512 formed in metallization layer M1 makes electrical contact to a silicide region 534 of a source or drain region 532 of a transistor 538. Likewise, in region 530b of the semiconductor device 500, a conductive line formed in metallization layer M2 makes electrical contact to a silicide region 540 of a gate 542 of a transistor 538.

The embodiment shown in FIG. 5 is advantageous because the novel barrier layer 506/508 or 506/514/508 enables the ability to form contacts comprised of copper. In conventional semiconductor devices, tungsten (W) was used for the material of contacts, which has an increased resistance compared to copper. Furthermore, W as a contact material can result in void formation in the fill process, higher electromigration resistance and increased defects. Thus, the use of the barrier layers 506/508 or 506/514/508 and copper as a conductive fill material 512 result in lower resistance contacts, improved device quality, improved electromigration resistance, and decreased device defects. Contacts having a lower total series resistance $R_s$ value can be achieved, e.g., by controlling the amount of a recess in an underlying conductive material (e.g., into the silicide 540 or 534), and by controlling the thickness of the second material layer 508, for example.

Embodiments of the present invention include semiconductor devices 100, 200, 300, 400, and 500 manufactured in accordance with the methods described herein.

Advantages of embodiments of the invention include providing improved barrier layers 106/108, 206/214/208, 306/308, 306/314/308, 406/408, 406/414/408, 506/508, and 506/514/508 and methods of formation thereof. The novel barrier layers 106/108, 206/214/208, 306/308, 306/314/308, 406/408, 406/414/408, 506/508, and 506/514/508 provide improved diffusion prevention and have increased oxidation resistance. The barrier layers 106/108, 206/214/208, 306/308, 306/314/308, 406/408, 406/414/408, 506/508, and 506/514/508 have a high level of thermal stability and anti-oxidation properties.

The novel barrier layers 106/108, 206/214/208, 306/308, 306/314/308, 406/408, 406/414/408, 506/508, and 506/514/508 provide a reliable and high performance barrier layer that is thermally stable, even at very small thicknesses. Using a HfN-containing first material layer 106, 206, 306, 406, and 506 with a Ta or Ti layer (second material layer 108, 208, 308, 408, or 508) disposed directly over and abutting thereon, or also with a TaN or TiN layer (third material layer 214, 314, 414, or 514) disposed between and directly abutting both the first material layer 106, 206, 306, 406, and 506 and the second material layer 108, 208, 308, 408, or 508, results in an excellent copper diffusion barrier layer 106/108, 206/214/208, 306/308, 306/314/308, 406/408, 406/414/408, 506/508, and 506/514/508 that maintains excellent barrier properties even at high temperatures, such as after being exposed to a rapid thermal anneal (RTA) at about 1,000° C. for about 1 minute, as an example.

The barrier layers 106/108, 206/214/208, 306/308, 306/314/308, 406/408, 406/414/408, 506/508, and 506/514/508 are adapted to repeatedly sustain BEOL thermal budgets in multi-level interconnect processes, for example. Thus, the barrier layers 106/108, 206/214/208, 306/308, 306/314/308, 406/408, 406/414/408, 506/508, and 506/514/508 may be used as a barrier layer and process as a contact liner, followed by a copper plating process to form contacts in multi-level interconnect structures, as shown in FIG. 6, providing low resistivity void-free contacts. Because the resistance of the copper contacts is reduced, smaller contacts may be formed, allowing the ability to reduce the size of the contacts in interconnect structures and scale semiconductor devices.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a patterned insulating material layer comprising a plurality of trenches disposed over a workpiece;
a first material layer disposed over at least sidewalls of the plurality of trenches of the patterned insulating material layer, the first material layer comprising a nitride-based metal compound;
a second material layer disposed over the first material layer, the second material layer comprising Ti, wherein the second material layer and the first material layer are not lining bottom surfaces of the plurality of trenches, and wherein the first material layer covers all portions of the sidewalls of the plurality of trenches; and
a conductive material disposed over the second material layer within the patterned insulating material layer.

2. The semiconductor device according to claim 1, wherein the first material layer and the second material layer comprise thicknesses of about 100 Angstroms or less.

3. The semiconductor device according to claim 1, wherein the first material layer and the second material layer comprise a barrier layer that prevents a portion of the conductive material from moving into the patterned insulating material layer.

4. The semiconductor device according to claim 1, wherein the first material layer comprises a high dielectric constant (k) material having a dielectric constant k of greater than about 3.9, or a transition metal nitride material.

5. The semiconductor device according to claim 1, wherein the first material layer comprises one or two elements from columns IVb, Vb, or VIb of the periodic table combined with nitride.

6. A semiconductor device comprising:
a silicide material layer having a top surface disposed over a workpiece;
a first insulating material layer in a first metallization level disposed over the silicide material layer;
a second insulating material layer disposed in a second metallization level disposed over the first insulating material layer, wherein the first and the second metallization levels comprise a level for metal lines or vias, and wherein the second metallization level is a different metal level from the first metallization level;
a trench disposed in the first and the second insulating material layers, wherein a width of the trench in the first insulating material layer is substantially the same as a width of the trench in the second insulating material layer;
a HfN (hafnium nitride) layer lining the trench;
a metal nitride layer disposed over the HfN layer;
a metal layer lining the metal nitride layer, the metal layer comprising Ta or Ti;
a conductive layer lining the metal layer, wherein the conductive layer contacts the top surface of the silicide material layer; and
a conductive fill material disposed over the conductive layer and filling the trench.

7. The semiconductor device according to claim 6, wherein the first and the second metallization levels comprises level for metal lines.

8. The semiconductor device according to claim 6, wherein the first metallization level comprises a first via level, wherein the second metallization level comprises a first metal line level.

9. The semiconductor device according to claim 8, further comprising:
a third insulating material layer in a second via level disposed over the second insulating material layer; and
a fourth insulating material layer in a second metal line level disposed over the third insulating material layer, wherein the trench extends into the third and the fourth insulating material layers.

10. The semiconductor device according to claim 6, wherein the silicide material layer is disposed on a source/drain region of a transistor.

11. The semiconductor device according to claim 6, wherein the silicide material layer is disposed on a gate region of a transistor.

12. The semiconductor device according to claim 6, wherein the HfN layer has a dielectric constant greater than about 3.9.

13. The semiconductor device according to claim 6, wherein the conductive fill material comprises copper.

14. The semiconductor device according to claim 6, wherein the metal nitride layer comprises TaN or TiN.

15. The semiconductor device according to claim 6, wherein the HfN (hafnium nitride) layer, the metal nitride layer, the metal layer, the conductive layer, and the conductive fill material form a gate contact.

16. The semiconductor device according to claim 6, wherein the HfN (hafnium nitride) layer, the metal nitride layer, the metal layer, the conductive layer, and the conductive fill material form a source/drain contact.

17. A semiconductor device comprising:
a silicide material layer having a top surface disposed over a workpiece;
a first insulating material layer in a first metallization level disposed over the silicide material layer;
a second insulating material layer disposed in a second metallization level disposed over the first insulating material layer, wherein the first and the second metallization levels comprise a level for metal lines or vias, and wherein the second metallization level is a different metal level from the first metallization level;
a trench disposed in the first and the second insulating material layers, wherein a width of the trench in the first insulating material layer is substantially the same as a width of the trench in the second insulating material layer;
a HfN (hafnium nitride) layer lining the trench;
a metal nitride layer disposed over the HfN layer;
a metal layer lining the metal nitride layer, the metal layer comprising Ta or Ti; and
a conductor disposed over the metal layer, the conductor contacting the top surface of the silicide material layer.

18. The semiconductor device according to claim 17, wherein the HfN (hafnium nitride) layer, the metal nitride layer, the metal layer, and the conductor form a gate contact.

19. The semiconductor device according to claim 17, wherein the HfN (hafnium nitride) layer, the metal nitride layer, the metal layer, and the conductor form a source/drain contact.

20. The semiconductor device according to claim 17, wherein the first metallization level comprises a first via level, wherein the second metallization level comprises a first metal line level.

21. The semiconductor device according to claim 20, further comprising:
a third insulating material layer in a second via level disposed over the second insulating material layer; and
a fourth insulating material layer in a second metal line level disposed over the third insulating material layer, wherein the trench extends into the third and the fourth insulating material layers.

22. The semiconductor device according to claim 20, wherein the silicide material layer is disposed on a source/drain region of a transistor.

23. The semiconductor device according to claim 20, wherein the silicide material layer is disposed on a gate region of a transistor.

24. The semiconductor device according to claim 20, wherein the conductor comprises copper.

25. The semiconductor device according to claim 20, wherein the metal nitride layer comprises TaN.

26. The semiconductor device according to claim 20, wherein the metal nitride layer comprises TiN.

* * * * *